United States Patent
Chooi et al.

(10) Patent No.: US 6,690,091 B1
(45) Date of Patent: Feb. 10, 2004

(54) DAMASCENE STRUCTURE WITH REDUCED CAPACITANCE USING A BORON CARBON NITRIDE PASSIVATION LAYER, ETCH STOP LAYER, AND/OR CAP LAYER

(75) Inventors: Simon Chooi, Singapore (SG); Yi Xu, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/666,316

(22) Filed: Sep. 21, 2000

Related U.S. Application Data

(62) Division of application No. 09/435,434, filed on Nov. 22, 1999, now Pat. No. 6,165,891.

(51) Int. Cl.[7] .......................... H01L 23/48; H01L 23/52
(52) U.S. Cl. ........................................ 257/758; 257/751
(58) Field of Search ................................. 257/750–766

(56) References Cited

U.S. PATENT DOCUMENTS

| | | | | |
|---|---|---|---|---|
| 5,708,559 A | | 1/1998 | Brabazon et al. ............ 361/313 |
| 5,739,579 A | * | 4/1998 | Chiang et al. ............... 257/635 |
| 5,821,169 A | | 10/1998 | Nguyen et al. .............. 438/736 |
| 5,834,845 A | | 11/1998 | Stolmeijer ................... 257/752 |
| 5,856,706 A | * | 1/1999 | Lee ............................. 257/758 |
| 5,904,565 A | | 5/1999 | Nguyen et al. .............. 438/687 |
| 6,083,822 A | * | 7/2000 | Lee ............................. 438/624 |
| 6,144,099 A | * | 11/2000 | Lopatin et al. .............. 257/758 |
| 6,218,302 B1 | * | 4/2001 | Braeckelmann et al. .... 438/687 |
| 6,232,235 B1 | * | 5/2001 | Cave et al. .................. 438/715 |
| 6,316,359 B1 | * | 11/2001 | Simpson ...................... 438/678 |
| 6,352,940 B1 | * | 3/2002 | Seshan et al. ............... 438/762 |
| 6,358,842 B1 | * | 3/2002 | Zhou et al. .................. 438/633 |
| 6,372,636 B1 | * | 4/2002 | Chooi et al. ................. 438/639 |
| 6,376,353 B1 | * | 4/2002 | Zhou et al. .................. 438/612 |

* cited by examiner

*Primary Examiner*—Eddie Lee
*Assistant Examiner*—Douglas W. Owens
(74) *Attorney, Agent, or Firm*—George O. Saile; Rosemary L. S. Pike

(57) ABSTRACT

A damascene structure with reduced capacitance dielectric stacking comprise a passivation, a first dielectric, an etch stop, a second dielectric and a cap layer over a first conductive layer formed on a semiconductor. The passivation, the etch stop, and the cap layers comprise low dielectric constant materials carbon nitride, boron nitride, or boron carbon nitride. The stack is patterned to form a via opening to the first conductive layer. A trench opening is formed stopping on the etch stop layer. A barrier layer of TaN, WN, TaSiN or Ta and a second conductive material is applied to the openings. Passivation, etch stop, or cap layers can be formed with carbon nitride by magnetron sputtering from a graphite target in a nitrogen atmosphere; boron carbon nitride by magnetron sputtering from a graphite target in a nitrogen and $B_2H_6$ atmosphere; or boron nitride by PECVD using $B_2H_6$, ammonia, and nitrogen.

7 Claims, 3 Drawing Sheets

DAMASCENE STRUCTURE WITH REDUCED CAPACITANCE USING A BORON CARBON NITRIDE PASSIVATION LAYER, ETCH STOP LAYER, AND/OR CAP LAYER

This is a division of patent application Ser. No. 09/435,434, filing date Nov. 22, 1999 now U.S. Pat. No. 6,165,891. A Damascene Structure With Reducedcapacitance Using Carbon Nitride, Boron Nitride, Or Boron Carbon Nitride Passivation Layer, Etch Stop Layer, And/Or Cap Layer, assigned to the same assignee as the present invention.

BACKGROUND OF THE INVENTION

1. Field of the Invention

This invention relates generally to fabrication of a semiconductor device and more particularly to a method and structure for forming a damascene structure with reduced capacitance by using carbon nitride, boron nitride, or boron carbon nitride to form a low-K passivation layer, etch stop layer, and/or cap layer.

2. Description of the Prior Art

As semiconductor dimensions continue to shrink and device density continues to increase, capacitance between conductive structures becomes increasingly important. With a smaller amount of dielectric material separating conductive structures, the dielectric constant must be increased to provide the same capacitance. However, materials for a passivation layer, an etch stop layer, and a cap layer are typically chosen for their etch selectivity properties.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,834,845 (Stolmeijer) shows a damascene interconnect method which discloses a BN etch stop layer, but states that a silicon nitride etch stop layer is preferred. This invention does not show a passivation layer or a cap layer, nor does it disclose any method for forming a BN etch stop layer.

U.S. Pat. No. 5,821,169 (Nguyen et al.) shows a dual damascene process with a hard mask (cap layer) material selected from a group of insulating materials including BN. This invention teaches that the hard mask material should be selected for etch selectivity to the inter level dielectric layer, and does not disclose any method for forming a BN hard mask layer.

U.S. Pat. No. 5,904,565 (Nguyen et al.) shows a dual damascene process with various cap, etch stop, and barrier layers.

U.S. Pat. No. 5,708,559 (Brabozon et al.) teaches a damascene capacitor process with a dielectric layer of BN.

SUMMARY OF THE INVENTION

It is an object of the present invention to provide a method for forming a damascene structure with reduced capacitance.

It is another object of the present invention to provide a method for forming a damascene structure with reduced capacitance using passivation layer, etch stop layer and/or cap layer comprising carbon nitride, boron nitride, or boron carbon nitride.

It is another object of the present invention to provide a method for forming a passivation layer, an etch stop layer, and/or a cap layer using materials having a low dielectric constant ($\approx 3$) which is compatible with existing semiconductor fabrication processes and equipment.

It is yet another object of the present invention to provide a damascene structure with reduced capacitance using passivation layer, etch stop layer and/or cap layer comprising carbon nitride, boron nitride, or boron carbon nitride.

To accomplish the above objectives, the present invention provides a method for forming a damascene structure with reduced capacitance by forming one or more of: the passivation layer, the etch stop layer, and the cap layer using a low dielectric constant material comprising carbon nitride, boron nitride, or boron carbon nitride. The method begins by providing a semiconductor structure having a first conductive layer thereover. A passivation layer is formed on the first conductive layer. A first dielectric layer is formed over the passivation layer, and an etch stop layer is formed over the first dielectric layer. A second dielectric layer is formed over the etch stop layer, and an optional cap layer can be formed over the second dielectric layer. The cap layer, the second dielectric layer, the etch stop layer, and the first dielectric layer are patterned to form a via opening stopping on said passivation layer and a trench opening stopping on said etch stop layer. A carbon nitride passivation layer, etch stop layer, or cap layer can be formed by magnetron sputtering from a graphite target in a nitrogen atmosphere. A boron nitride passivation layer, etch stop layer, or cap layer can be formed by PECVD using $B_2H_6$, ammonia, and nitrogen. A boron carbon nitride passivation layer, etch stop layer, or cap layer can be formed by magnetron sputtering from a graphite target in a nitrogen and $B_2H_6$ atmosphere.

The present invention provides considerable improvement over the prior art. One or more of: the passivation layer, the etch stop layer, and the cap layer can be formed comprising carbon nitride or carbon boron nitride using a magnetron sputtering process, or comprising boron nitride using a PECVD process. The invention therefore provides a method of forming a damascene structure with a reduced capacitance by allowing one or more layers to be formed using a material having a low dielectric constant using existing equipment and process. Also, by selecting which layers are formed using a low dielectric constant material, the present invention provides a method for forming a damascene structure which optimizes performance, reliability and fabrication cost.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a damascene structure with reduced capacitance using a low dielectric constant material for one or more of: the passivation layer, the etch stop layer, and the cap layer.

Figure 1:
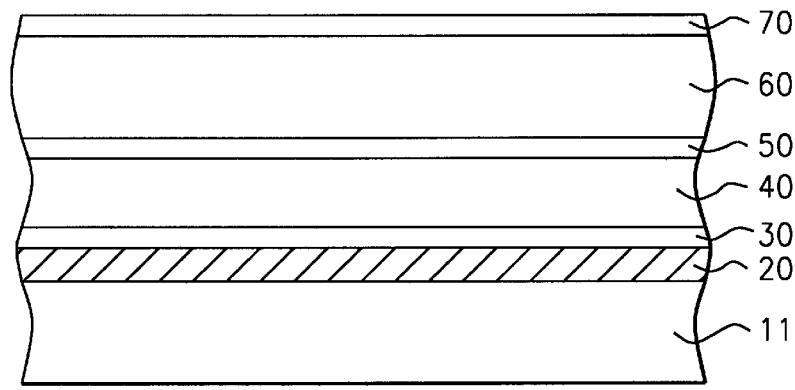
FIGS. 1 through 5 illustrate sequential sectional views of a process for forming a damascene structure using carbon nitride, boron nitride, or boron carbon nitirde to form the passivation layer, the etch stop layer, and/or the cap layer according to the invention.

Referring to FIG. 1, the preferred embodiment of the present invention begins by providing a semiconductor structure (11) having a conductive layer (20) thereover. Semiconductor structure (11) should be understood to include a substrate or wafer comprising a semiconducting material such as silicon or germanium, or a silicon-on-insulator (SOI) structure as is known in the art. Semiconductor structure (11) should be understood to possibly further include one or more layers of insulating material, dielectric material, and/or conductive material and one or more active and/or passive devices formed in or over the substrate or the like. The conductive layer (20) can be comprise a metal, most preferably copper, or any other conductive material such as doped silicon. Typically, the first conductive layer (20) is an interconnect pattern or line.

Still referring to FIG. 1, a passivation layer (30) is formed on the first conductive layer (20). The passivation layer (30) can be comprise silicon nitride, which has a dielectric constant of about 7. However, a passivation layer (30) comprising carbon nitride (dielectric constant between about 1.8 and 3.6), boron nitride (dielectric constant between about 2.5 and 3.8), or boron carbon nitride (dielectric constant between about 1.8 and 3.5) reduces capacitance between conductive structures. Reduced capacitance provides a key advantage in performance and reliability for sub-micron devices.

A passivation layer (30) can comprise carbon nitride having a thickness of between about 50 Angstroms and 3000 Angstroms can be formed by magnetron sputtering using a graphite target and a nitrogen sputtering gas. The passivation layer is formed using a power of between about 1 kw and 10 kw, a magnetic field of between about 50 guass and 200 guass, a temperature of between about 20° C. and 500° C., and a pressure of between about 0.1 mTorr and 500 mTorr. The deposited carbon nitride can be amorpous or crystalline $C_X N_Y$ (0.5<X<4, 0.5<Y<5).

Alternatively, the passivation layer (30) can comprise boron nitride having a thickness of between about 50 Angstroms and 3000 Angstroms formed by plasma enhanced chemical vapor deposition using $B_2H_6$, ammonia, and nitrogen. The boron nitride can be deposited at a pressure of between about 0.5 Torr and 100 Torr, at a temperature of between about 100° C. and 500° C., and an RF power of between about 100 watts and 2000 watts at an RF frequency of about 13.56 MHz. The $B_2H_6$ to ammonia flow rate ratio is between about 1 $B_2H_6$:1 ammonia and 1 $B_2H_6$:200 ammonia, and the $B_2H_6$ to nitrogen flow rate ratio is between about 1 $B_2H_6$:1 nitrogen and 1 $B_2H_6$:200 nitrogen. Alternatively, borazine (B2N3H6) and nitrogen, without ammonia, can be used to form the a boron nitride passivation layer (30) using the same processing conditions and flow rate described immediately above.

Yet another alternative is to form a passivation layer (30) comprising boron carbon nitride having a thickness of between about 50 Angstroms and 3000 Angstroms by magnetron sputtering using a graphite target and a sputtering gas comprising nitrogen and $B_2H_6$. The flow rate ratio of $B_2H_6$ to nitrogen is between about 1 $B_2H_6$:1 nitrogen and 1 $B_2H_6$:200 nitrogen. A boron carbon nitride passivation layer (30) can be formed using a power of between about 1 kw and 10 kw, a magnetic field of between about 50 guass and 200 guass, a temperature of between about 20° C. and 500° C., and a pressure of between about 0.1 mTorr and 500 mTorr. Alternatively, borazine ($B_3N_3H_6$) can be used in place of $B_2H_6$.

Still referring to FIG. 1, a first dielectric layer (40) is formed over the passivation layer (30). The first dielectric layer (40) is comprising an insulating material, such as silicon dioxide, hydrogen-doped silicon dioxide, fluorine-doped silicon dioxide, carbon-doped silicon dioxide, an organic polymer (comprising carbon and hydrogen), or a fluorine-doped organic polymer. The first dielectric layer preferably has a thickness of between about 2000 Angstroms and 10,000 Angstroms.

Still referring to FIG. 1, an etch stop layer (50) is formed over the first dielectric layer (40). The etch stop layer (50) can be comprising silicon nitride, which has a dielectric constant of about 7. However, an etch stop layer (50) comprising carbon nitride (dielectric constant between about 1.8 and 3.6), boron nitride (dielectric constant between about 2.5 and 3.8), or boron carbon nitride (dielectric constant between about 1.8 and 3.5) reduces capacitance between conductive structures. The etch stop layer (50) can be formed comprising carbon nitride, boron nitride, or boron carbon nitride using one of the methods described hereabove. It is important to note that the either the passivation layer (30), or the etch stop layer (50), or both may comprise carbon nitride, boron nitride, or boron carbon nitride, in order to optimize the performance, reliability and fabrication cost.

Still referring to FIG. 1, a second dielectric layer (60) is formed over the etch stop layer (50). The second dielectric layer (60) is comprised of an insulating material, such as silicon dioxide, hydrogen-doped dilicon dioxide, fluorine-doped silicon dioxide, carbon-doped silicon dioxide, an organic polymer (comprising carbon and hydrogen), or a fluorine-doped organic polymer. The second dielectric layer preferably has a thickness of between about 2000 Angstroms and 10,000 Angstroms.

Still referring to FIG. 1, an optional cap layer (70) may be formed over the second dielectric layer (60). The cap layer (70) can comprise silicon nitride, which has a dielectric constant of about 7. However, a cap layer (70) comprising carbon nitride (dielectric constant between about 1.8 and 3.6), boron nitride (dielectric constant between about 2.5 and 3.8), or boron carbon nitride (dielectric constant between about 1.8 and 3.5) reduces capacitance between conductive structures. The cap layer (70) can be comprised of carbon nitride, boron nitride, or boron carbon nitride using one of the methods described hareabove. The cap layer (70), when comprising one of the three aforementioned insulators, provides an effective stop layer for a subsequent chemical-mechanical polishing process. Again, it is important to note that the cap layer alone can comprise carbon nitride, boron nitride, or boron carbon nitride; either the passivation layer (30) or the etch stop layer (50) and the cap layer can comprise carbon nitride, boron nitride, or boron carbon nitride; or the the passivation layer (30), the etch stop layer (50), and the cap layer (70) can all comprise carbon nitride, boron nitride, or boron carbon nitride in order to optimize the performance, reliability and fabrication cost.

Figure 2:
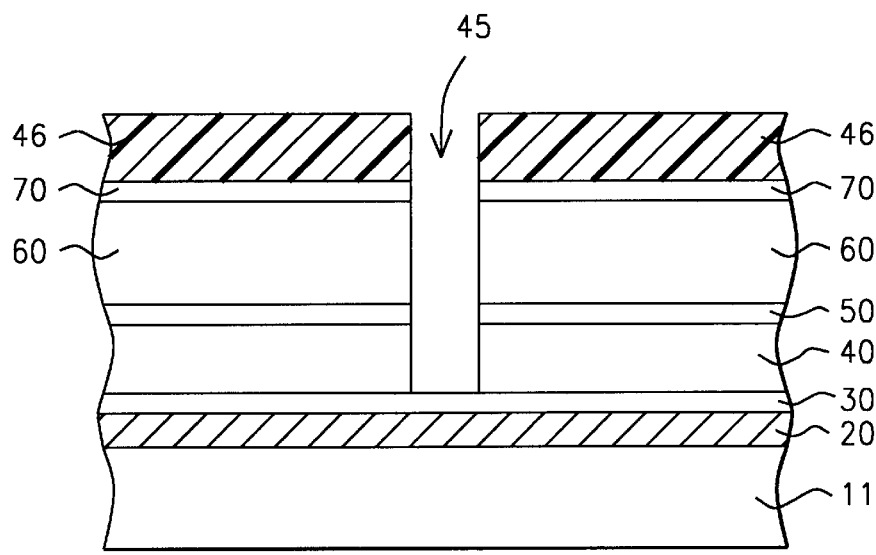
Figure 3:
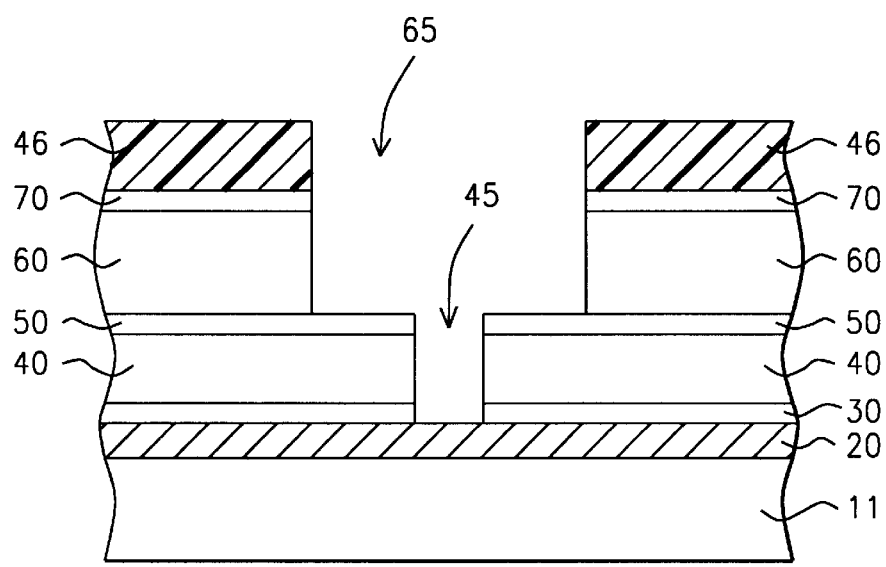

Referring to FIGS. 2 and 3, the cap layer (70), the second dielectric layer (60), the etch stop layer (50), and the first dielectric layer (40) are patterned to form a via opening (45)

stopping on the passivation layer and a trench opening (65) stopping on the etch stop layer. The patterning can be performed using any of a number of methods known in the art. A preferred method is described herebelow, however it should be understood that the present invention is not limited to this preferred method.

For example, as shown in FIG. 2, a first photoresist mask (46) with an optional bottom anti-reflective coating layer, and having an opening over the intended location for a via can be formed over the cap layer (70) and second dielectric layer (60). The cap layer (70), the second dielectric layer (60), the etch stop layer (50), and the first dielectric layer (40) are etched through the opening in the first photoresist mask (46) to form a via opening (45), and the first photoresist mask (46) is removed.

A cap layer (70) comprising carbon nitride can be etched using a mixture of hydrogen and nitrogen (forming gas); or oxygen and nitrogen; or chlorine and boron trichloride at a pressure of between about 5 mTorr and 500 mTorr, at a top power of between about 50 Watts and 2000 Watts, and at a bottom power of between about 50 Watts and 2000 Watts. For the hydrogen and nitrogen chemistry, the gas flow rates are between about 5 sccm and 500 sccm of hydrogen and between about 5 sccm and 2000 sccm of nitrogen, although it is understood by those skilled in the art that the flow rates can be scaled up or down depending on chamber size provided that the molar ratios are maintained. For the oxygen and nitrogen chemistry, the gas flow rates are between about 5 sccm and 1000 sccm of oxygen and between about 5 sccm and 2000 sccm nitrogen, althogh again the flow rates can be scaled. For the chlorine and boron trichloride chemistry, the flow rates are between about 10 sccm and 200 sccm of chlorine, between about 10 sccm and 200 sccm of boron trichloride, and between about 5 sccm and 100 sccm of nitrogen, although again the flow rates can be scaled. Each of these etch chemistries provide a selectivity of carbon nitride to silicon dioxide of greater than 2:1, a selectivity of carbon nitride to silicon nitride (a high-K dielectric material) of greater than 2:1.

A cap layer (70) comprising boron nitride can be etched using a mixture of hydrogen and nitrogen (forming gas) or oxygen and nitrogen using the conditions and flow rates as described hereabove. Each of these etch chistries provide a selectivity of boron nitride to silicon dioxide of greater than 2:1, and a selectivity of boron nitride to silicon nitride (a high-K dielectric material) of greater than 2:1. A cap layer (70) comprising boron carbon nitride can be etched using a mixture of hydrogen and nitrogen (forming gas) or oxygen and nitrogen using the conditions and flow rates as described hereabove. Each of these etch chemistries provide a selectivity of boron carbon nitride to silicon dioxide of greater than 2:1, and a selectivity of boron carbon nitride to silicon nitride (a high-K dielectric material) of greater than 2:1.

The Second dielectric layer (60) can then be etched using a reactive ion etch with a $CF_4/CHF_3$ chemistry (for doped or undoped silicon dioxide) or a $N_2H_2$ chemistry (for organic polymer or fluoride-doped organic polymer), stopping on the etch stop layer (50). This $CF_4/CHF_3$ etch chemistry provides a selectivity of silicon dioxide to carbon nitride of greater than 2:1, a selectivity to silicon dioxide to boron nitride of greater than 3:1, and a selectivity of silicon dioxide to boron carbon nitride of greater than 2:1.

An etch stop layer (50) comprising carbon nitride can be etched using a mixture of hydrogen and nitrogen; oxygen and nitrogen; or chlorine and boron trichloride as described hereabove. An etch stop layer (50) comprising boron nitride can be etched using a mixture of hydrogen and nitrogen; or oxygen and nitrogen as described hereabove. An etch stop layer (50) comprising boron carbon nitride can be etched using a mixture of hydrogen and nitrogen; or oxygen and nitrogen as described hereabove.

The first dielectric layer (40) can be etched using a $CF_4/CHF_3$ (for doped or undoped silicon dioxide) or $N_2H_2$ (for organic polymer or fluorine-doped organic polymer).

As shown in FIG. 3, a second photoresist mask (66) having an opening over the intended location for a trench can be formed over the cap layer (70) and the second dielectric layer (60). The cap layer (70) exposed through the opening in the second photoresist mask (66) is etched using a reactive ion etch with a the chemistry and conditions described hereabove (e.g. hydrogen and nitrogen; oxygen and nitrogen; or chlorine and boron trichloride). Then, a trench opening (65) is etched in the second dielectric layer (60) using a reactive ion etch with a $CF_4/CHF_3$ or $N_2H_2$ chemistry, stopping on the etch stop layer (50). The second photoresist mask (66) is removed. Either before or after the second photoresist mask (66) is removed, a further etching using $CF_4/CHF_3$ is performed to open the via opening (45) through the passivation layer (30) contacting the conductive layer (20). Other photolithigraphy and etch methods can be used to form a trench opening (65) and a via opening (45), and the invention is not limited to the method shown in FIGS. 2 & 3 and described above.

Figure 4:
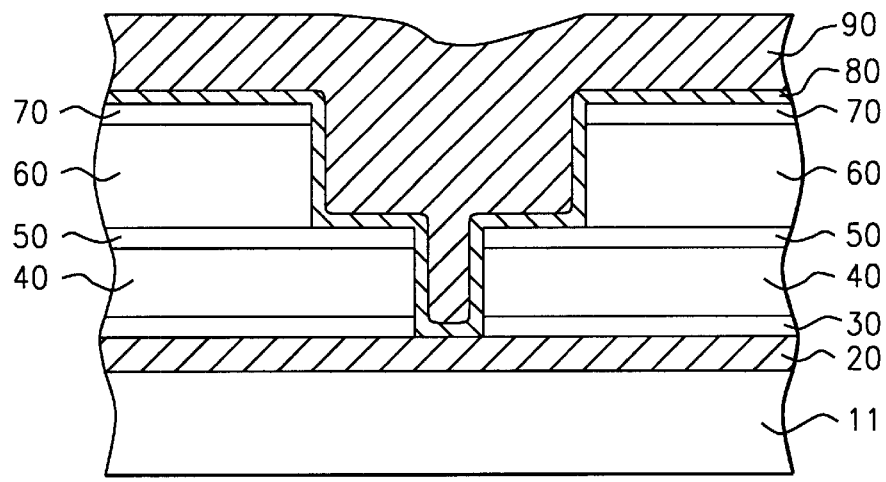

Referring to FIG. 4, a barrier layer (80) is formed on the bottoms and sidewalls of the via opening (45) and the trench opening (65). The barrier layer (80), which prevents migration of the subsequently formed second metal layer (90) and provides good adhesion for the subsequently formed second metal layer (90), can comprise, but is not limited to: TaN, WN, TaSiN, or Ta having a thickness of between about 50 and 2000 Angstroms.

Still referring to FIG. 4, a second metal layer (90) is formed on the barrier layer (80). The second metal layer (90) is preferably copper, and has a sufficient thickness to completely fill the via opening (45) and the trench opening (65).

Figure 5:
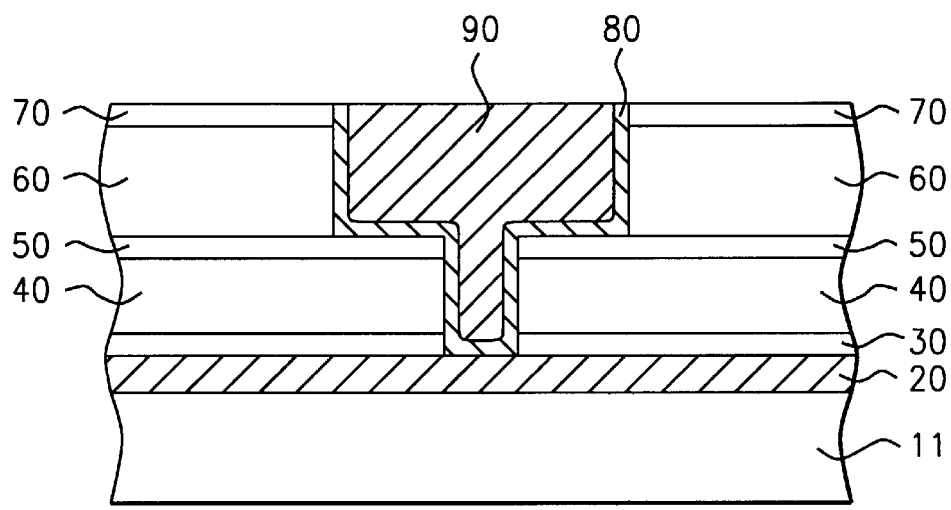

Referring to FIG. 5, the second metal layer (90) and the barrier layer (80) are palnarized to form a damascene structure. Preferably, the second metal layer (90) and the barrier layer (80) are planarized using a chemical mechanical polishing process.

Figure 6:
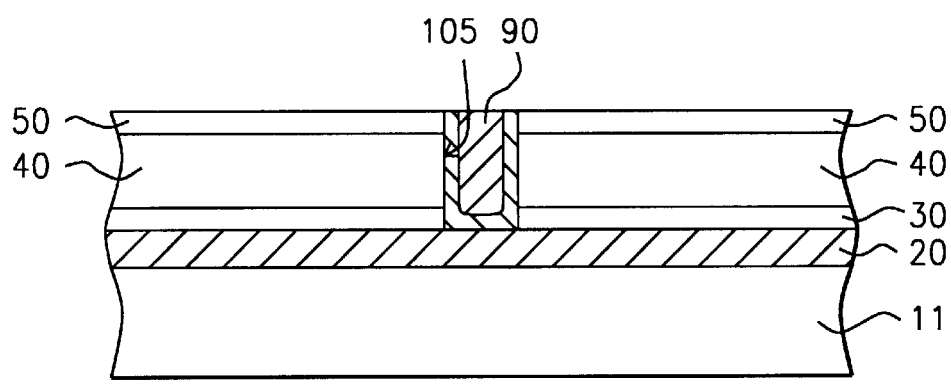
FIG. 6 illustrates a single damascene structure using carbon nitride, boron nitride, or boron carbon nitirde to form the passivation layer and/or the cap layer according to the invention.

FIG. 6 shows an alternate damascene structure formed according to the present invention. A single damascene structure can be formed using only one dielectric layer and a single damascene opening. A passivation layer (30) is formed on a conductive layer (20) overlying a semiconductor structure (11). A first dielectric layer (40) is formed on the passivation layer. An optional cap layer (70) can be formed on the first dielectric layer (40). The optional cap layer (70) and the first dielectric layer (40) are patterned to form a damascene opening (105). A passivation layer (80) is formed on the bottom and sidewalls of the damascene opening (105), and the damascene openining is filled with a second metal layer (90) to form a contact to the conductive layer (20) through the first dielectric layer (40). The passivation layer (30) and/or the optional cap layer (70) comprise carbon nitride, boron nitride, or boron carbon nitride deposited and etched using the processes described herein.

While the invention has been particularly shown and described with reference to the preferred embodiments thereof, it will be understood by those skilled in the art that various changes in form and details may be made without departing from the spirit and scope of the invention. For example, although a via first, dual damascene process is described for illustrative purposes, the invention can also be used for other damascene processes.

What is claimed is:

1. A damascene structure comprising:
   a passivation layer formed on a first conductive layer overlying a semiconductor structure;
   a first dielectric layer formed on said passivation layer;
   an etch stop layer formed on said first dielectric layer;
   a via opening formed through said etch stop layer, said first dielectric layer and said passivation layer stopping on said first conductive layer;
   a second dielectric layer formed on said etch stop layer, said second dielectric layer having a trench opening therein stopping on said etch stop layer; and
   a second conductive layer formed in said trench opening and said via opening;
   wherein said passivation layer or said etch stop layer comprise boron carbon nitride.

2. The damascene structure of claim 1 wherein the remaining said passivation layer or said etch stop layer comprise carbon nitride or boron nitride.

3. The damascene structure of claim 2 which further comprises a cap layer overlying said second dielectric layer; and wherein said cap layer comprises carbon nitride, boron nitride or boron carbon nitride.

4. The damascene structure of claim 1 wherein a barrier layer conforming to the walls of said trench opening and said via opening is disposed between said second conductive layer and said walls of said trench opening and said via opening, said barrier layer comprising TaN, WN, TaSiN or Ta.

5. A damascene structure comprising:
   a passivation layer comprising boron carbon nitride formed on a first conductive layer overlying a semiconductor structure;
   a first dielectric layer formed on said passivation layer; said first dielectric layer having a damascene opening therein; and
   a second conductive layer formed in said damascene opening.

6. A damascene structure comprising:
   a passivation layer formed on a first conductive layer overlying a semiconductor structure;
   a first dielectric layer formed on said passivation layer, said first dielectric layer having a damascene opening therein;
   a cap layer formed on said first dielectric layer;
   said cap layer and/or said passivation layer comprising boron carbon nitride; and
   a second conductive layer formed in said damascene opening.

7. The damascene structure of claim 6 wherein the remaining said passivation layer or said cap layer comprises carbon nitride or boron nitride.

* * * * *

UNITED STATES PATENT AND TRADEMARK OFFICE
CERTIFICATE OF CORRECTION

PATENT NO. : 6,690,091 B1
DATED : February 10, 2004
INVENTOR(S) : Simon Chooi, Yi Xu and Mei Sheng Zhou It is certified that error appears in the above-identified patent and that said Letters Patent is hereby corrected as shown below:

<u>Title page, Item [54] and Column 1, lines 1-4,</u>
Title, should read -- DAMASCENE STRUCTURE WITH REDUCED CAPACITANCE USING A CARBON NITRIDE, BORON NITRIDE, OR BORON CARBON NITRIDE PASSIVATION LAYER, ETCH STOP LAYER, AND/OR CAP LAYER --.

Signed and Sealed this

Twenty-second Day of June, 2004

JON W. DUDAS
*Acting Director of the United States Patent and Trademark Office*